United States Patent [19]
Schröder

[11] Patent Number: 4,640,877
[45] Date of Patent: Feb. 3, 1987

[54] PROCESS FOR THE OZONE PROTECTION BY PHOTOPOLYMER-FLEXOPRINTING PLATES BY ALCOHOL-SOLUBLE POLYAMIDES

[75] Inventor: Hans L. Schröder, Reinheim, Fed. Rep. of Germany

[73] Assignee: E. I. Du Pont de Nemours and Company, Wilmington, Del.

[21] Appl. No.: 716,118

[22] Filed: Mar. 26, 1985

[30] Foreign Application Priority Data

Apr. 21, 1984 [DE] Fed. Rep. of Germany ....... 3415044

[51] Int. Cl.$^4$ ........................... G03F 7/02; G03C 5/16
[52] U.S. Cl. ........................................ 430/14; 430/18; 430/306; 430/309; 430/331; 430/907; 430/961; 430/286; 430/325; 430/271
[58] Field of Search ................. 430/306, 309, 331, 14, 430/18, 907, 961, 286, 325, 271

[56] References Cited

U.S. PATENT DOCUMENTS 4,197,130 3/1980 Nakamura et al. ............. 430/496 X
4,323,637 4/1982 Chen et al. ........................... 430/271
4,430,417 2/1984 Heinz et al. ..................... 430/281 X
4,452,879 6/1984 Fickes et al. .................... 430/325 X

FOREIGN PATENT DOCUMENTS 146464 2/1981 Fed. Rep. of Germany .

OTHER PUBLICATIONS

Don E. Floyd, *Polyamide Resins*, second edition, Reinhold Publishing Corporation, New York, 1966, pp. 178-185, 197-199.
"Multi", *The American Heritage Dictionary*, Second College Edition, Houghton Mifflin Company, Boston, Mass., 1976, p. 821.
"Multi-", *Webster's Seventh New Collegiate Dictionary*, G. & C. Merriam Company, Springfield, Mass., 1967, p. 556.
"Misch-Polymer: Sat.", *A German-English Dictionary for Chemists* by Patterson, third edition, John Wiley & Sons, Inc., New York, N.Y., 1959, p. 301.
Gessner G. Hawley, "Nylon" from *The Condensed Chemical Dictionary*, Tenth edition, Van Nostrand Reinhold Company, New York, N.Y., 1981, p. 749.
BASF Technical Bulletin: Ultramid ® 1 C, May 1974, (Translation included).

*Primary Examiner*—John E. Kittle
*Assistant Examiner*—Cynthia Hamilton

[57] ABSTRACT

A process for the ozone protection of photopolymer flexographic printing plates using alcohol soluble polyamides, which are applied onto the exposed and developed surface of the flexographic printing plate in a mixed solution comprising n-propanol and n-butanol, e.g., 10 to 90% and 90 to 10% by weight, respectively.

12 Claims, No Drawings

4,640,877

PROCESS FOR THE OZONE PROTECTION BY PHOTOPOLYMER-FLEXOPRINTING PLATES BY ALCOHOL-SOLUBLE POLYAMIDES

FIELD OF THE INVENTION

The invention relates to a process for the ozone protection of photopolymer flexographic printing plates by application of alcohol-soluble polyamides.

BACKGROUND OF THE INVENTION

On account of their easier production, photopolymer flexographic printing plates, as described, for example, in U.S. Pat. No. 4,323,637, German Pat. Nos. 2,138,582, and 2,223,808 as well as U.S. Pat. No. 4,197,130, have been used extensively in flexographic printing. Such plates are exposed using high intensity UV-light. The ozone formed thereby can react with the elastomeric binder constituents of the plates, as, for example, polystyrene-polyisoprene-polystyrene and polystyrene-polybutadiene-polystyrene block copolymers, as described in U.S. Pat. No. 4,323,637, causing embrittlement and cracking. The aforementioned patents are incorporated herein by reference.

In order to counteract this undesirable effect ozone protective agents may be incorporated in the photosensitive composition. For example, the following antiozonants are described in U.S. Pat. No. 4,323,637: Microcrystalline wax and paraffin wax, dibutyl thiourea, 1,1,3,3-tetramethyl-2-thiourea, norbornene, e.g., di-5-norbornene-2-methyl adipate, di-5-norbornene-2-methyl maleate, di-5-norbornene-2-methyl terephthalate, N-phenyl-2-naphthylamine, unsaturated vegetable oils, e.g. rapeseed oil, linseed oil, and safflower oil, polymers and resins, e.g., ethylene-vinyl acetate copolymers, chlorinated polyethylene, chlorosulfonated polyethylene, chlorinated ethylene-methacrylic acid copolymer, polyurethanes, polypentadienes, polybutadienes, resins derived from furfurol, ethylene-propylene-diene rubber, diethylene glycol esters of resins and copolymers of α-methyl styrene with vinyl toluene.

In actual practice, however, these additives often provide insufficient resistance against undesirable embrittlement and crack formation, especially with high ozone concentrations. Moreover, this problem cannot be eliminated by incorporating large quantities of antiozonants alone because this adversely affects the sensitometric and mechanical properties of the photopolymer materials.

Especially high ozone concentrations are found when flexible packaging materials, such as paper, cardboard or plastic films such as polyethylene and polypropylene films are printed on. In order to obtain sufficient adhesion of the printing ink to the polyethylene or polypropylene film, these films are pretreated before printing with electrical spark discharge, which produces considerable quantities of ozone. Because this pretreatment is most effective when applied immediately before the printing process, it is unavoidable that the flexographic printing plates are exposed to the ozone thus generated. The elastomeric parts of the flexographic printing plate react with the ozone by becoming brittle. This can lead to cracking, especially under the strong mechanical stress exerted on flexographic printing plates in a mounted state.

Underlying this invention is the need to increase the ozone resistance of photopolymer flexographic printing plates already mounted on printing cylinders, thereby improving the long-term storage stability of such mounted plates even in the presence of high ozone levels, as found in film printing operations.

BRIEF SUMMARY OF THE INVENTION

In accordance with this invention there is provided a process for the ozone protection of an imagewise exposed and developed photopolymer flexographic printing plate having an elastomeric polymeric binder which comprises
(a) applying to at least the exposed and developed surface of the flexographic printing plate a solution of an alcohol-soluble polyamide copolymer having a softening temperature above 120° C. in a solvent mixture consisting essentially of 10 to 90% by weight of n-propanol and 90 to 10% by weight of n-butanol, and
(b) drying the treated flexographic printing plate to remove the solvent mixture whereby a polyamide layer is formed on the surface of the flexographic printing plate.

DETAILED DESCRIPTION OF THE INVENTION

As noted above this invention relates to the treatment of photopolymer flexographic printing plates subsequent to imagewise exposure and liquid development which removes the unpolymerized areas. Useful photopolymer flexographic materials are those which contain an elastomeric binder, e.g., unsaturated elastomers, as well as ethylenically unsaturated compounds and photoinitiators as is known to those skilled in the art. Preferred binders are block copolymer binders as described in U.S. Pat. Nos. 4,197,130, 4,323,637, and 4,430,417, which are incorporated herein by reference. Examples of such elastomeric block copolymer binders include: styrene/butadiene/styrene; styrene/isoprene/styrene; styrene/butadiene or isoprene/homopolymer or copolymer of at least one aliphatic diene hydrocarbon with 4 to 5 carbon atoms; also, three-block copolymers wherein the two terminal blocks are random blocks of styrene and butadiene and/or isoprene and the central block is a homopolymer of butadiene or isoprene.

Among alcohol-soluble polyamides having a softening temperature above 120° C. and a number average molecular weight ($\overline{M}_n$) of 5000 to 25,000, copolymers containing 20–40% by weight of adipic acid/hexamethylenediamine, sebacic acid/hexamethylenediamine, adipic acid/p,p'-diaminodicyclohexylmethane, and caprolactam, have proven to be especially advantageous.

It is surprising that by using solvent mixtures comprising n-propanol and n-butanol the effectiveness against crack formation is substantially better than with solutions containing pure n-propanol or n-butanol. Preferably a solvent mixture consisting essentially of 10% to 90% by weight of n-propanol and 90% to 10% by weight of n-butanol is used, and more preferably a mixture of 25% to 75% of n-propanol and 75% to 25% n-butanol. An especially good result occurs with a 1:1 mixture ratio of the two alcohols. This good effect is lost when using other solvents.

Preferably, a solution containing between 1 and 10% by weight of the polyamides is used. A solution containing 5% of polyamide copolymer has proved to be effective. The amount of the polyamides applied is preferably 0.5–10 mg/cm$^2$ of the flexographic printing plate. Preferably, the entire surface of the printing plate as well as the sides rather than only the printing parts is treated.

The alcoholic polyamide solution can be applied to the flexographic printing plate manually by using a cotton swab, sponge or brush, or by dipping the printing plate into a bath. The polyamide solutions can also be applied mechanically, for example, by spraying or rinsing.

Subsequently, the flexographic printing plate is dried, e.g., at ambient temperature or elevated temperature up to 40° C., to remove the solvent mixture whereby a solid polyamide film is formed.

Flexographic printing plates treated in this manner exhibit very good aging behavior. They retain their original flexibility even during relatively long storage times on the printing cylinder before and after the printing process and do not have a tendency to form cracks. This result is surprising and unexpected, because it is known that polyamides themselves are ozone sensitive and must be stabilized against the disadvantageous influence of ozone (East German Pat. No. 146,464). Moreover, the subsequent application of antiozonants such as polyurethane or paraffin, known from U.S. Pat. No. 4,323,637, does not provide sufficient ozone protection.

These facts are explained in greater detail in the following examples wherein the parts and percentages are by weight. Polymeric molecular weights are expressed as number average molecular weights ($\overline{M}_n$). The $\overline{M}_n$ for the polymers described herein can be determined by gel permeation chromatography employing a known standard, e.g., polybutadiene or another standard known to those skilled in the art. The softening temperature referred to herein is the Ball and Ring Softening Temperature, ASTM Procedure E-28.

EXAMPLE 1

A flexographic printing plate containing ozone protective agents is produced according to the data of Example 36 of U.S. Pat. No. 4,323,637. The image formed in the exposed and developed flexographic printing plate is made nontacky by immersion in a 0.4% aqueous chlorine or bromine solution, is rinsed with water and is dried. Subsequently six samples 3 cm×7 cm, with a thickness of 2.8 mm, are produced from the printing plate thus prepared. These are mounted using a molding strip onto a printing cylinder with a 5 cm diameter.

While Sample 1 remains untreated, Samples 2–6 are treated with liquids A–E listed in Table 1 using a cotton swab and are air dried at room temperature.

TABLE 1

A Solvent mixture comprising 25% n-propanol and 75% n-butanol.

B 5 g of a polyamide copolymer[1] comprising adipic acid/hexamethylenediamine, adipic acid/p,p'-diaminodicyclohexylmethane, and caprolactam in a 1:1:1 ratio by weight, are dissolved at 50° C. in 95 g of a solvent mixture comprising 25% n-propanol and 75% n-butanol. Subsequently the solution is cooled to room temperature.

C 5 g of a polyamide multipolymer comprising 40% adipic acid/hexamethylenediamine, 30% sebacic acid/hexamethylenediamine, and 30% caprolactam, with an average molecular weight of about 25,000, are dissolved at 50° in 95 g of a solvent mixture comprising 25% n-propanol and 75% n-butanol. Subsequently the solution is cooled to room temperature.

D An uncrosslinked liquid isocyanate polyester (polyurethane) according to Ullmanns Encyclopedia, 3rd edition (1957), Vol. 9, p. 345 is used.

E A melt comprising paraffin wax produced at 50° C. is used.

[1] Ultramid ®1C, a product of BASF AG, D-6700 Ludwigshafen,, Federal Republic of Germany.

The printing cylinder carrying the mounted samples in placed in an ozone chamber with 12 ppm ozone to attain an accelerated formation of cracks. While under actual conditions in a printing operation with about 0.1 ppm ozone the untreated flexographic printing plates exhibit crack formation after approximately 2–3 months, a comparable state is reached in the ozone chamber in about 5 minutes.

The following results are obtained:

TABLE 2

| Sample | Treatment | Time until the start of the formation of cracks in minutes |
|---|---|---|
| 1. | Untreated (control) | 5 |
| 2. | A (control) | 5 |
| 3. | B | 25 |
| 4. | C | 25 |
| 5. | D (control) | 5 |
| 6. | E (control) | 5 |

These examples indicate, that by using a 5% solution of polyamide copolymer B or C in a solvent mixture comprising 25% n-propanol and 75% n-butanol, [Samples 3 and 4, above] the undesired ozone-induced formation of cracks of the flexographic printing plate is not seen until 25 minutes exposure, while with control Samples 1 and 2 the formation of cracks occurs after only 5 minutes. The use of control Samples 5 and 6, polyurethane (D) and paraffin wax (E), respectively, leads to no improvement.

The influence of different solvents on the formation of cracks is demonstrated by the following examples.

EXAMPLE 2

5 g of polyamide copolymer B from Table 1, Example 1, are dissolved at 50° C. in 95 g of each of the following solvents: (1) methanol; (2) ethanol; (3) n-propanol; (4) n-butanol and (5) a solvent mixture comprising 75% n-propanol and 25% n-butanol. After cooling, the solutions are applied onto the mounted samples and are exposed to ozone, as described in Example 1. The results are summarized in Table 3:

TABLE 3

| | Treatment with a 5% solution of polyamide B in | Time until the start of the formation of cracks in minutes |
|---|---|---|
| Sample | Solvent | |
| 1. | methanol | 5 |
| 2. | ethanol | 5 |
| 3. | n-propanol | 8 |
| 4. | n-butanol | 10 |
| 5. | n-propanol/ n-butanol (75%/25%) | 30 |

As can be seen from Table 3, the solution of polyamide B in a mixture comprising 75% n-propanol and 25% n-butanol is clearly better than solutions in pure n-propanol or pure n-butanol. No stabilizing effect against the formation of cracks is observed with methanol or ethanol solutions.

EXAMPLE 3

The influence of different solvent mixtures on the formation of cracks is demonstrated in Table 4. Here, 5% solutions of polyamide C from Table 1, in each of the following solvent mixtures, (1) ethanol/n-butanol 50%/50%; (2) n-propanol/n-butanol 50%/50%; (3) acetone/n-butanol 50%/50%; (4) ethyl acetate/n-butanol 50%/50% and perchloroethylene/n-butanol 50%/50%, are prepared and processed as described in Example 1.

TABLE 4

| Sample | Treatment with a 5% solution of polyamide C in Solvent | Time until the start of the formation of cracks in minutes |
|---|---|---|
| 1. | ethanol/n-butanol 50%/50% | 5 |
| 2. | n-propanol/n-butanol 50%/50% | 60 |
| 3. | acetone/n-butanol 50%/50% | 10 |
| 4. | ethyl acetate/ n-butanol 50%/50% | 10 |
| 5. | perchloroethylene/n-butanol 50%/50% | 8 |

The results summarized in Table 4 show the surprisingly good effect of the solution of 5% polyamide C in a mixture comprising 50% n-propanol and 50% n-butanol according to the invention.

I claim:

1. A process for the ozone protection of an imagewise exposed and developed photopolymer flexographic printing plate having an elastomeric polymeric binder which comprises
   (a) applying to at least the exposed and developed surface of the flexographic printing plate a solution of an alcohol-soluble polyamide copolymer having a softening temperature above 120° C. in a solvent mixture consisting essentially of 10 to 90% by weight of n-propanol and 90 to 10% by weight of n-butanol, and
   (b) drying the treated flexographic printing plate to remove the solvent mixture whereby a polyamide layer is formed on the surface of the flexographic printing plate.

2. A process according to claim 1 wherein the alcohol-soluble polyamide is a copolymer containing 20 to 40% by weight of three or more of adipic acid/hexamethylenediamine, adipic acid/p,p'-diaminodicyclohexylmethane, sebacic acid/hexamethylenediamine, and caprolactam, and having a number average molecular weight of about 5,000 to 25,000.

3. Process according to claim 1 wherein the alcohol-soluble polyamide is a copolymer of adipic acid/hexamethylenediamine (20 to 40 weight %), sebacic acid/hexamethylenediamine (20 to 40 weight %) asnd caprolactam (20 to 40 weight %), having a number average molecular weight of about 5000 to 25,000.

4. Process according to claim 1 wherein the alcohol-soluble polyamide is a copolymer of adipic acid/hexamethylenediamine (20 to 40 weight %), adipic acid/p,p'-diaminodicyclohexylmethane (20 to 40 weight %) and caprolactam (20 to 40 weight %), having a number average molecular weight of about 5000 to 25,000.

5. Process according to claim 1 wherein 0.5 to 10 mg per $cm^2$ of the polyamide copolymer is applied onto the surface of the flexographic printing plate.

6. Process according to claim 2 wherein 0.5 to 10 mg per $cm^2$ of the polyamide copolymer is applied onto the surface of the flexographic printing plate.

7. Process according to claim 3, wherein 0.5 to 10 mg per $cm^2$ of the polyamide copolymer is applied onto the surface of the flexographic printing plate.

8. Process according to claim 4, wherein 0.5 to 10 mg per $cm^2$ of the polyamide copolymer is applied onto the surface of the flexographic printing plate.

9. Process according to claim 1, wherein the polyamide solution contains 1 to 10% percent by weight of the polyamide copolymer.

10. Process according to claim 1 wherein the alcohol-soluble polyamide copolymer is present as a 5% by weight solution.

11. A process according to claim 1 wherein the elastomeric binder is a block copolymer taken from the group consisting of styrene/butadiene/styrene, styrene/isoprene/styrene, styrene/butadiene/homopolymer or copolymer of at least one aliphatic diene hydrocarbon with 4 to 5 carbon atoms, and styrene/isoprene/homopolymer or copolymer of at least one aliphatic diene hydrocarbon with 4 to 5 carbon atoms.

12. An image bearing photopolymer flexographic printing plate having an elastomeric polymeric binder protected from ozone according to the process of claim 1.

* * * * *